US011929376B2

(12) United States Patent
Yamaguchi

(10) Patent No.: US 11,929,376 B2
(45) Date of Patent: Mar. 12, 2024

(54) SOLID-STATE IMAGING DEVICE AND IMAGING APPARATUS

(71) Applicant: Sony Group Corporation, Tokyo (JP)

(72) Inventor: Tetsuji Yamaguchi, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/184,295

(22) Filed: Mar. 15, 2023

(65) Prior Publication Data

US 2023/0282658 A1 Sep. 7, 2023

Related U.S. Application Data

(63) Continuation of application No. 18/078,734, filed on Dec. 9, 2022, which is a continuation of application (Continued)

(30) Foreign Application Priority Data

Oct. 11, 2011 (JP) .................................. 2011-223856

(51) Int. Cl.
*H01L 27/146* (2006.01)
*H01L 31/101* (2006.01)
(Continued)

(52) U.S. Cl.
CPC .. *H01L 27/14614* (2013.01); *H01L 27/14638* (2013.01); *H01L 27/1464* (2013.01);
(Continued)

(58) Field of Classification Search
CPC ......... H01L 27/14614; H01L 27/14638; H01L 27/1464; H01L 27/14645; H01L 27/14647
See application file for complete search history.

(56) References Cited

U.S. PATENT DOCUMENTS 6,930,336 B1 8/2005 Merrill
9,018,688 B2 4/2015 Yamaguchi
(Continued)

FOREIGN PATENT DOCUMENTS

CN 101740592 6/2010
CN 102110702 6/2011
(Continued)

OTHER PUBLICATIONS

U.S. Appl. No. 18/078,734, filed Dec. 9, 2022, Yamaguchi.
(Continued)

*Primary Examiner* — Nathan W Ha
(74) *Attorney, Agent, or Firm* — Sheridan Ross PC

(57) ABSTRACT

The present technique relates to a solid-state imaging device and an imaging apparatus that enable provision of a solid-state imaging device having superior color separation and high sensitivity. The solid-state imaging device includes a semiconductor layer in which a surface side becomes a circuit formation surface, photoelectric conversion units PD1 and PD2 of two layers or more that are stacked and formed in the semiconductor layer, and a longitudinal transistor Tr1 in which a gate electrode is formed to be embedded in the semiconductor layer from a surface of the semiconductor layer. The photoelectric conversion unit PD1 of one layer in the photoelectric conversion units of the two layers or more is formed over a portion of the gate electrode of the longitudinal transistor Tr1 embedded in the semiconductor substrate and is connected to a channel formed by the longitudinal transistor Tr1.

12 Claims, 8 Drawing Sheets

Related U.S. Application Data

No. 17/400,270, filed on Aug. 12, 2021, now Pat. No. 11,569,281, which is a continuation of application No. 16/892,925, filed on Jun. 4, 2020, now Pat. No. 11,227,884, which is a continuation of application No. 16/359,209, filed on Mar. 20, 2019, now Pat. No. 10,715,768, which is a continuation of application No. 15/674,890, filed on Aug. 11, 2017, now Pat. No. 10,271,023, which is a continuation of application No. 15/273,289, filed on Sep. 22, 2016, now Pat. No. 9,762,867, which is a continuation of application No. 15/086,890, filed on Mar. 31, 2016, now Pat. No. 9,466,645, which is a continuation of application No. 14/613,002, filed on Feb. 3, 2015, now Pat. No. 9,369,647, which is a continuation of application No. 14/348,992, filed as application No. PCT/JP2012/075041 on Sep. 28, 2012, now Pat. No. 9,018,688.

(51) Int. Cl.
| | |
|---|---|
| *H04N 9/64* | (2023.01) |
| *H04N 23/75* | (2023.01) |
| *H04N 23/88* | (2023.01) |
| *H04N 25/11* | (2023.01) |
| *H04N 25/70* | (2023.01) |
| *H04N 25/71* | (2023.01) |
| *H04N 25/711* | (2023.01) |
| *H04N 25/75* | (2023.01) |
| *H10K 39/32* | (2023.01) |

(52) U.S. Cl.
CPC .. *H01L 27/14645* (2013.01); *H01L 27/14647* (2013.01); *H01L 31/1013* (2013.01); *H04N 9/646* (2013.01); *H04N 23/75* (2023.01); *H04N 23/88* (2023.01); *H04N 25/11* (2023.01); *H04N 25/70* (2023.01); *H04N 25/71* (2023.01); *H04N 25/711* (2023.01); *H04N 25/75* (2023.01); *H10K 39/32* (2023.02)

(56) References Cited

U.S. PATENT DOCUMENTS

| | | | |
|---|---|---|---|
| 9,369,647 | B2 | 6/2016 | Yamaguchi |
| 9,466,645 | B2 | 10/2016 | Yamaguchi |
| 9,762,867 | B2 * | 9/2017 | Yamaguchi ....... H01L 27/14645 |
| 10,271,023 | B2 | 4/2019 | Yamaguchi |
| 10,715,768 | B2 | 7/2020 | Yamaguchi |
| 11,227,884 | B2 * | 1/2022 | Yamaguchi ......... H01L 31/1013 |
| 11,569,281 | B2 * | 1/2023 | Yamaguchi ............ H10K 39/32 |
| 2005/0167704 | A1 | 8/2005 | Ezaki et al. |
| 2007/0131987 | A1 | 6/2007 | Kim |
| 2007/0218578 | A1 | 9/2007 | Lee et al. |
| 2008/0044942 | A1 | 2/2008 | Park |
| 2008/0055443 | A1 | 3/2008 | Okamoto et al. |
| 2008/0197389 | A1 | 8/2008 | Park et al. |
| 2009/0207294 | A1 | 8/2009 | Hynecek et al. |
| 2009/0243019 | A1 | 10/2009 | Kawai |
| 2010/0117126 | A1 | 5/2010 | Takahashi |
| 2010/0264474 | A1 * | 10/2010 | Iwabuchi ............ H01L 27/1464 257/292 |
| 2011/0079832 | A1 | 4/2011 | Masagaki et al. |
| 2011/0084322 | A1 | 4/2011 | Kang |
| 2011/0108897 | A1 | 5/2011 | Koo et al. |
| 2011/0109762 | A1 | 5/2011 | Park et al. |
| 2011/0168872 | A1 | 7/2011 | Kobayashi et al. |
| 2011/0181747 | A1 | 7/2011 | Kido et al. |
| 2011/0181749 | A1 * | 7/2011 | Yamada ............ H01L 27/14638 257/E31.073 |
| 2011/0216212 | A1 | 9/2011 | Watanabe et al. |
| 2011/0233702 | A1 | 9/2011 | Takahashi et al. |
| 2011/0234830 | A1 | 9/2011 | Kiyota et al. |
| 2011/0234868 | A1 | 9/2011 | Yamashita et al. |
| 2012/0008026 | A1 | 1/2012 | Akiyama |
| 2012/0012899 | A1 | 1/2012 | Jin et al. |
| 2012/0038014 | A1 | 2/2012 | Tai et al. |
| 2012/0086094 | A1 | 4/2012 | Watanabe et al. |
| 2012/0098081 | A1 | 4/2012 | Horiike et al. |
| 2012/0113292 | A1 | 5/2012 | Hirota et al. |
| 2012/0126247 | A1 | 5/2012 | Chen et al. |
| 2012/0193689 | A1 | 8/2012 | Park et al. |
| 2012/0199882 | A1 | 8/2012 | Shin |
| 2012/0205769 | A1 | 8/2012 | Tsai et al. |
| 2013/0015513 | A1 | 1/2013 | Kido et al. |
| 2013/0056800 | A1 | 3/2013 | Lyu et al. |
| 2013/0175582 | A1 | 7/2013 | Ihara et al. |
| 2013/0249040 | A1 | 9/2013 | Liu et al. |
| 2013/0292750 | A1 | 11/2013 | Chen et al. |
| 2013/0307040 | A1 | 11/2013 | Ahn et al. |
| 2013/0307103 | A1 | 11/2013 | Lin et al. |
| 2013/0341491 | A1 | 12/2013 | Hirose et al. |
| 2014/0094030 | A1 | 4/2014 | Shimotsusa |
| 2014/0131779 | A1 | 5/2014 | Takeda |
| 2014/0307142 | A1 | 10/2014 | Matsumoto |
| 2015/0001376 | A1 | 1/2015 | Miyanami |
| 2015/0069471 | A1 | 3/2015 | Kawamura |
| 2019/0214417 | A1 | 7/2019 | Matsuo |
| 2020/0251512 | A1 | 8/2020 | Im et al. |

FOREIGN PATENT DOCUMENTS

| | | |
|---|---|---|
| CN | 102196195 | 9/2011 |
| JP | H01-134966 | 5/1989 |
| JP | 2005-012007 | 1/2005 |
| JP | 2005-151077 | 6/2005 |
| JP | 2006-278446 | 10/2006 |
| JP | 2008-060476 | 3/2008 |
| JP | 2008-258316 | 10/2008 |
| JP | 2009-295937 | 12/2009 |
| JP | 2010-114323 | 5/2010 |
| KR | 2010-0051555 | 5/2010 |
| KR | 2010-0105377 | 9/2010 |
| KR | 2011-0011542 | 2/2011 |
| KR | 2011-0076769 | 7/2011 |

OTHER PUBLICATIONS

Official Action (with English translation) for Chinese Patent Application No. 201280048615.0 dated Dec. 10, 2015, 14 pages.
Official Action (with English translation) for Chinese Patent Application No. 201610740546.X dated Mar. 7, 2017, 18 pages.
Japanese Office Examination Report issued in connection with related Japanese Patent Application No. JP 2011-223856 dated Jan. 20, 2015.
Official Action (no English translation available) for Japanese Patent Application No. 2011-223856 dated Feb. 12, 2016, 2 pages.
Official Action (no English translation available) for Japanese Patent Application No. 2011-223856 dated Oct. 4, 2016, 41 pages.
Official Action (with English translation) for Korean Patent Application No. 10-2014-7005821, dated Dec. 18, 2018, 10 pages.
Official Action (with English translation) for Korea Patent Application No. 10-2020-7018720, dated Aug. 26, 2020, 7 pages.
Official Action (with English translation) for Korea Patent Application No. 10-2020-7018720, dated Feb. 23, 2021, 7 pages.
Official Action for Korea Patent Application No. 10-2020-7018720, dated Jul. 7, 2021, 4 pages.
Notice of Allowance for U.S. Appl. No. 14/348,992, dated Nov. 5, 2014, 8 pages.
Official Action for U.S. Appl. No. 14/613,002, dated Sep. 22, 2015, 7 pages.
Notice of Allowance for U.S. Appl. No. 14/613,002, dated Feb. 1, 2016, 5 pages.
Notice of Allowance for U.S. Appl. No. 15/086,890, dated Jun. 8, 2016, 9 pages.
Supplemental Notice of Allowance for U.S. Appl. No. 15/086,890, dated Jun. 30, 2016, 3 pages.

(56) References Cited

OTHER PUBLICATIONS

Notice of Allowance for U.S. Appl. No. 15/273,289, dated May 5, 2017, 9 pages.
Official Action for U.S. Appl. No. 15/674,890, dated Jul. 12, 2018, 7 pages.
Notice of Allowance for U.S. Appl. No. 15/674,890, filed Dec. 13, 2018, 8 pages.
Official Action for U.S. Appl. No. 16/359,209, dated Nov. 18, 2019, 9 pages.
Notice of Allowance for U.S. Appl. No. 16/359,209, dated Mar. 4, 2020, 7 pages.
Notice of Allowance for U.S. Appl. No. 16/892,925, dated Sep. 9, 2021, 9 pages.
Corrected Notice of Allowance for U.S. Appl. No. 16/892,925, dated Oct. 27, 2021, 2 pages.
Notice of Allowance for U.S. Appl. No. 17/400,270, dated Sep. 22, 2022, 11 pages.
Corrected Notice of Allowance for U.S. Appl. No. 17/400,270, dated Oct. 31, 2022, 2 pages.

\* cited by examiner

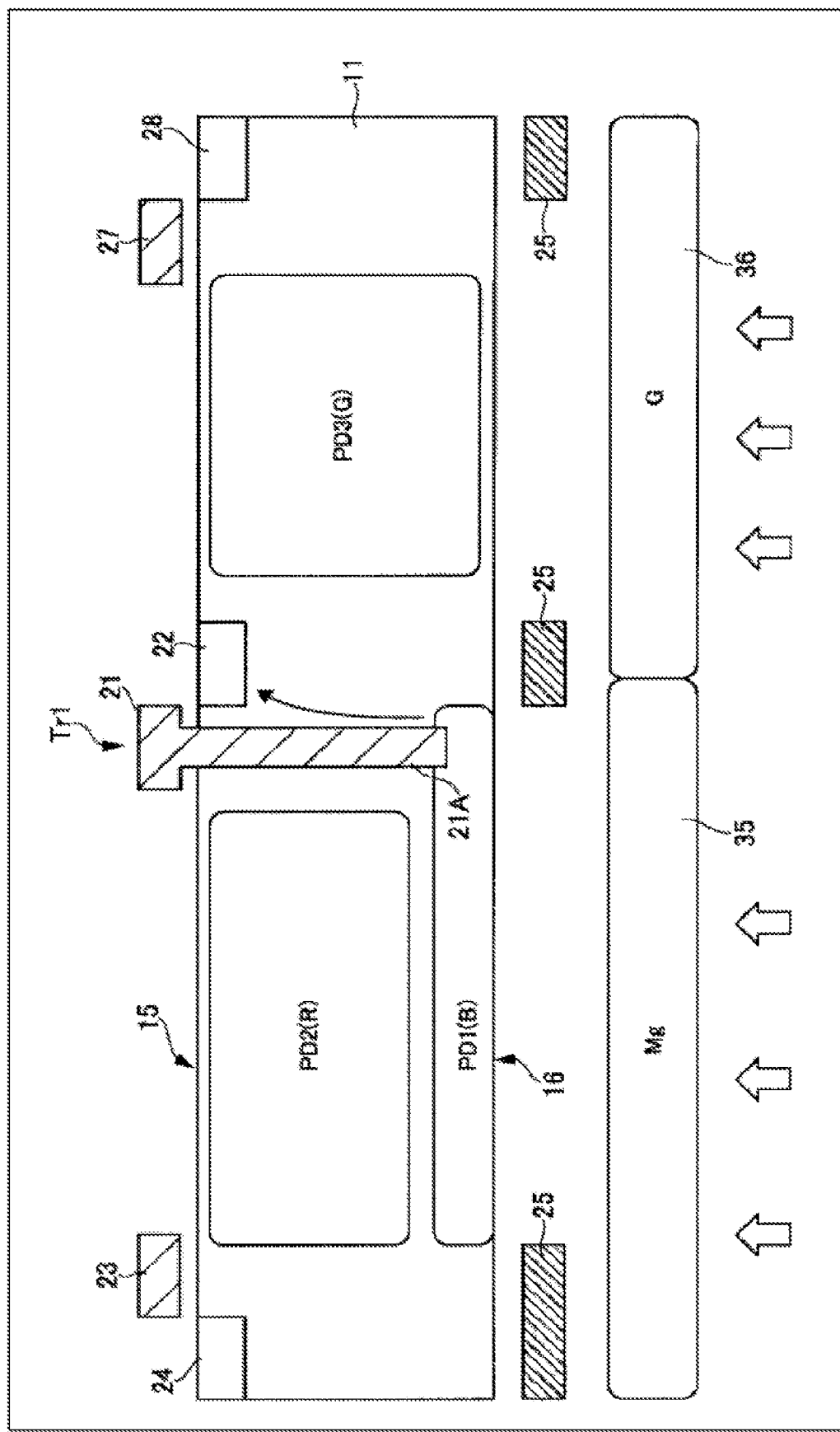

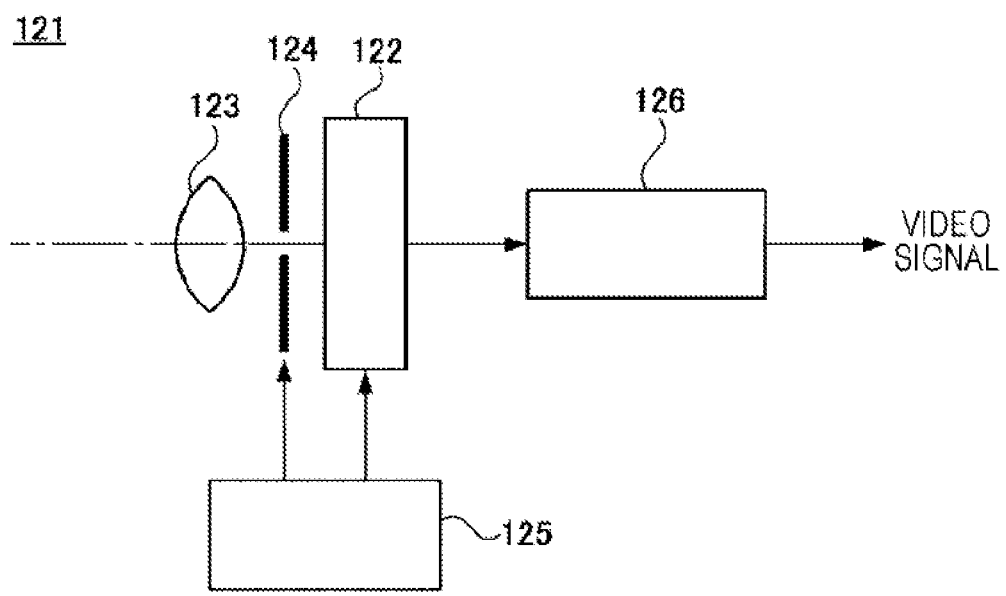

SOLID-STATE IMAGING DEVICE AND IMAGING APPARATUS

CROSS-REFERENCE TO RELATED APPLICATIONS

This application is a continuation of and claims priority to U.S. patent application Ser. No. 18/078,734, filed Dec. 9, 2022, which is a continuation of and claims priority to U.S. patent application Ser. No. 17/400,270, filed Aug. 12, 2021, now U.S. Pat. No. 11,569,281, which is a continuation of and claims priority to U.S. patent application Ser. No. 16/892,925, filed Jun. 4, 2020, now U.S. Pat. No. 11,227,884, which is a continuation of and claims priority to U.S. patent application Ser. No. 16/359,209 filed Mar. 20, 2019, now U.S. Pat. No. 10,715,768, which is a continuation of and claims priority to U.S. patent application Ser. No. 15/674,890, filed Aug. 11, 2017, now U.S. Pat. No. 10,271,023, which is a continuation of and claims priority to U.S. patent application Ser. No. 15/273,289, filed Sep. 22, 2016, now U.S. Pat. No. 9,762,867, which is a continuation of and claims priority to U.S. patent application Ser. No. 15/086,890, filed Mar. 31, 2016, now U.S. Pat. No. 9,466,645, which is a continuation of and claims priority to U.S. patent application Ser. No. 14/613,002, filed Feb. 3, 2015, now U.S. Pat. No. 9,369,647, which is a continuation of and claims priority to U.S. patent application Ser. No. 14/348,992, filed Apr. 1, 2014, now U.S. Pat. No. 9,018,688, which is a national stage application under 35 U.S.C. 371 and claims the benefit of PCT Application No. PCT/JP2012/075041, filed Sep. 28, 2012, which PCT application claimed the benefit of Japanese Patent Application No. JP 2011-223856, filed Oct. 11, 2011, the entire disclosures of each of which are hereby incorporated herein by reference.

TECHNICAL FIELD

The present technique relates to a solid-state imaging device suitable for a longitudinal spectroscopic image sensor and an imaging apparatus including the solid-state imaging device.

BACKGROUND ART

In an image sensor according to the related art, color filters are generally formed in a Bayer array.

However, in the Bayer array, because light absorbed by each color filter cannot be used for photoelectric conversion, use efficiency of the light may be degraded by an amount corresponding to the color filters.

Therefore, for the purpose of raising use efficiency of light more than the color filters of the Bayer array to achieve high sensitivity or high resolution, a longitudinal spectroscopic image sensor in which a plurality of photodiodes are stacked in the same pixel has been suggested (for example, refer to Patent Documents 1 to 3).

In the longitudinal spectroscopic image sensor using a silicon substrate, the photodiodes are stacked at different depths in silicon to perform a color separation using that an absorption wavelength of light is different depending on a depth of the silicon substrate.

In addition, the charge is transferred to a surface of the silicon substrate through a charge transfer path (hereinafter, referred to as an "implantation plug") formed by impurity implantation and having a charge gradient to read the charge from the photodiode formed in a deep portion of the silicon substrate.

Meanwhile, the charge that is accumulated in the photodiode near the surface of the silicon substrate is read to a floating diffusion using a transfer gate.

In the longitudinal spectroscopic image sensor having the above-described structure, when light leaks into the implantation plug or a field accumulation region near the surface, photoelectric conversion is generated by the leaked light.

However, because a wavelength component of the leaked light is different from a wavelength component of light on which photoelectric conversion is executed by a photodiode connected to the implantation plug, the charge by the light of the different wavelength components is mixed and color mixture is generated.

Therefore, a light shielding film needs to be formed on the implantation plug to perform superior color separation by preventing the color mixture from being generated.

Meanwhile, if the light shielding film is formed on the implantation plug, an aperture ratio on the photodiode decreases by an amount corresponding to the implantation plug and sensitivity decreases, as compared with a configuration of a photodiode of a single layer in which the implantation plug is not formed.

That is, in the structure of the longitudinal spectroscopic image sensor according to the related art, the merit of the superior use efficiency of the light cannot be utilized. In addition, because the aperture ratio decreases and the sensitivity decrease, the merit of the longitudinal spectrum cannot be utilized.

CITATION LIST

Patent Document

Patent Document 1: JP 2005-12007 A
Patent Document 2: JP 2005-151077 A
Patent Document 3: JP 2006-278446 A

SUMMARY OF THE INVENTION

Problems to be Solved by the Invention

In order to utilize the merits of the longitudinal spectroscopic image sensor, it is desirable to realize a structure in which the color mixture can be prevented from being generated, without decreasing the aperture ratio on the photodiode.

An object of the present technique is to provide a solid-state imaging device having superior color separation and high sensitivity and an imaging apparatus including the solid-state imaging device.

Solutions to Problems

A solid-state imaging device of the present technique includes: a semiconductor layer in which a surface side becomes a circuit formation surface; photoelectric conversion units of two layers or more that are stacked and formed in the semiconductor layer; and a longitudinal transistor in which a gate electrode is formed to be embedded in the semiconductor layer from a surface of the semiconductor layer.

The photoelectric conversion unit of one layer in the photoelectric conversion units of the two layers or more is formed over a portion of the gate electrode of the longitudinal transistor embedded in the semiconductor layer and is connected to the channel formed by the longitudinal transistor.

An imaging apparatus according to the present technique includes an optical system, the solid-state imaging device according to the present technique, and a signal processing circuit that processes an output signal of the solid-state imaging device.

According to a configuration of the solid-state imaging device according to the present technique described above, the photoelectric conversion unit of one layer in the photoelectric conversion units of the two layers or more is formed over a portion of the gate electrode of the longitudinal transistor embedded in the semiconductor layer and is connected to the channel formed by the longitudinal transistor.

Thereby, if the longitudinal transistor is turned on, the signal charge on which photoelectric conversion has been executed by the photoelectric conversion unit connected to the channel of the longitudinal transistor can be read to the surface side of the semiconductor layer to be the circuit formation surface.

In addition, during a charge accumulation period during which the longitudinal transistor is turned off, because the channel is not formed around the photoelectric conversion unit and the longitudinal transistor, the charge by light having the different wavelengths is not mixed and the color mixture is not generated. For this reason, even though a portion of the gate electrode is not covered with a light shielding film, the color mixture can be prevented from being generated. Thereby, as compared with a structure in which a portion of an implantation plug is covered with the light shielding film, an aperture ratio can be increased by widening an opening of the light shielding film.

In addition, because the photoelectric conversion unit is formed over the portion of the gate electrode embedded in the semiconductor layer, sensitivity can be improved by increasing an area of the photoelectric conversion unit, as compared with a structure in which the implantation plug is formed.

According to the configuration of the imaging apparatus according to the present technique described above, the imaging apparatus includes the solid-state imaging device according to the present technique. Therefore, in the solid-state imaging device, even though the portion of the gate electrode is not covered with the light shielding film, the color mixture can be prevented from being generated. In addition, the sensitivity can be improved by increasing the area of the photoelectric conversion unit.

Effects of the Invention

According to the present technique described above, because the color mixture is not generated, color separation is superior and an image having a superior image quality is obtained.

In addition, according to the present technique, because sensitivity can be improved by increasing an area of a photoelectric conversion unit, the high sensitivity is obtained.

Therefore, a solid-state imaging device having a superior image quality and high sensitivity and an imaging apparatus can be realized.

BRIEF DESCRIPTION OF DRAWINGS

FIG. 7 is a cross-sectional view of a main portion of a solid-state imaging device according to a sixth embodiment.

FIG. 8 is a diagram illustrating a planar array of color filters according to the sixth embodiment.

FIG. 9 is a schematic structural view (block diagram) of an imaging apparatus according to a seventh embodiment.

MODE FOR CARRYING OUT THE INVENTION

Hereinafter, best modes (hereinafter, referred to as embodiments) to carry out the present technique will be described.

The description will be made in the following order.
1. First embodiment (solid-state imaging device)
2. Second embodiment (solid-state imaging device)
3. Third embodiment (solid-state imaging device)
4. Fourth embodiment (solid-state imaging device)
5. Fifth embodiment (solid-state imaging device)
6. Sixth embodiment (solid-state imaging device)
7. Modification of solid-state imaging device
8. Seventh embodiment (Imaging apparatus)

1. First Embodiment (Solid-State Imaging Device)

Figure 1:
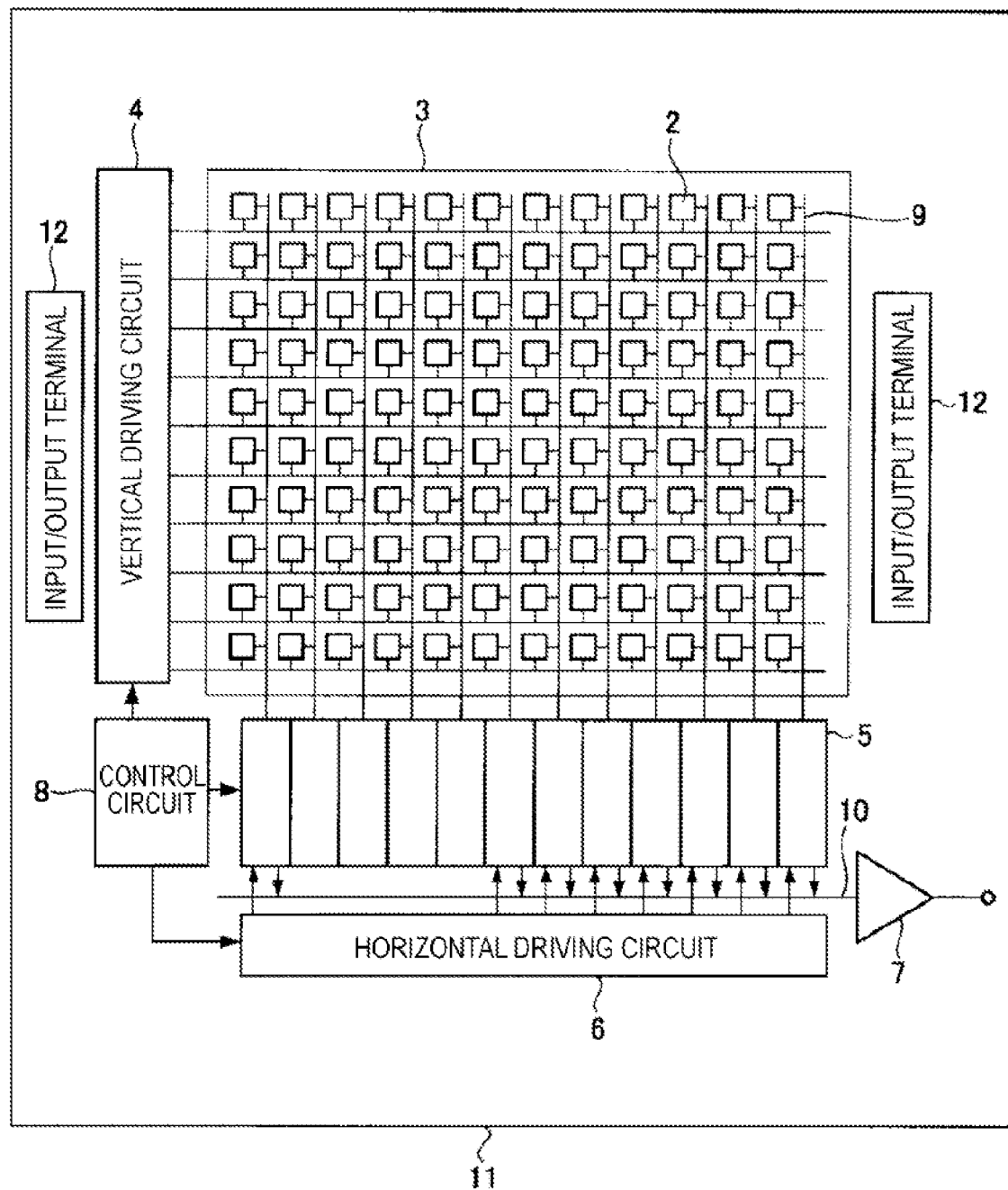
FIG. 1 is a schematic structural view (plan view) of a solid-state imaging device according to a first embodiment.

A schematic structural view (plan view) of a solid-state imaging device according to a first embodiment is illustrated in FIG. 1.

Figure 2:
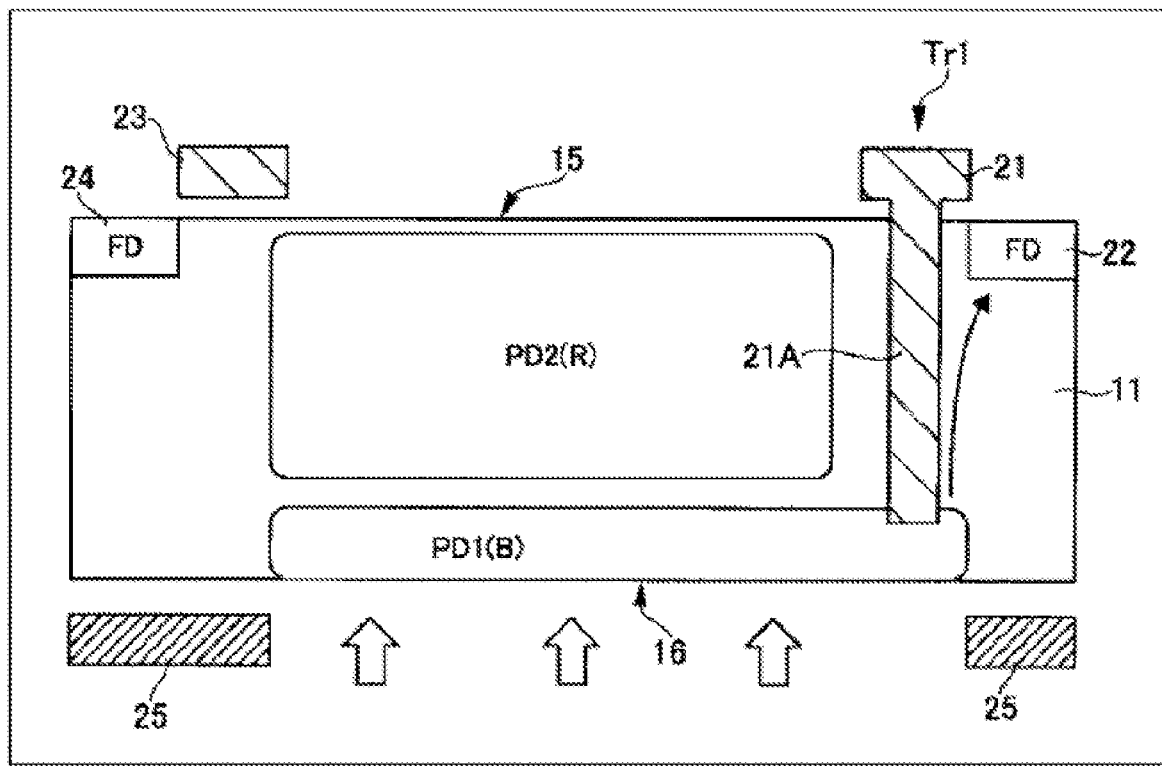
FIG. 2 is a cross-sectional view of a main portion of the solid-state imaging device according to the first embodiment.

In addition, a cross-sectional view of a main portion of the solid-state imaging device according to the first embodiment is illustrated in FIG. 2.

This embodiment is obtained by applying the present technique to a CMOS type solid-state imaging device (CMOS image sensor).

A solid-state imaging device 1 according to this embodiment includes a solid-state imaging element obtained by forming a pixel unit (so-called imaging region) 3 in which a plurality of pixels 2 each including a photoelectric conversion unit are arranged regularly and two-dimensionally and a peripheral circuit unit including a driving circuit and the like in a semiconductor substrate 11, for example, a silicon substrate, as illustrated in FIG. 1.

The pixel 2 has a photoelectric conversion unit and a pixel transistor composed of a MOS transistor.

As the pixel transistor, the pixel has at least one of, for example, a transfer transistor, a reset transistor, an amplification transistor, and a selection transistor.

The peripheral circuit unit has a vertical driving circuit 4, a column signal processing circuit 5, a horizontal driving circuit 6, an output circuit 7, a control circuit 8, and the like.

The vertical driving circuit 4 is configured by, for example, a shift register and selects a pixel driving wiring line, supplies pulses to drive the pixels to the selected pixel driving wiring line, and drives the pixels in a row unit. That is, the vertical driving circuit 4 selectively scans the pixels 2 of the pixel unit 3 sequentially in the row unit in a vertical direction and supplies a pixel signal based on a signal charge generated according to a light reception amount in the photoelectric conversion element (for example, a photodiode) of each pixel 2 through a vertical signal line 9 to the column signal processing circuit 5.

The column signal processing circuit 5 is arranged for each column of the pixels 2 and executes a signal process such as noise removal on signals output from the pixels of one row, for each pixel column. That is, the column processing circuit 5 executes a signal process such as CDS to remove fixed pattern noise peculiar to the pixels 2, signal amplification, and AD conversion. A horizontal selection switch (not illustrated in the drawings) is connected between an output step of the column signal processing circuit 5 and a horizontal signal line 10.

The output circuit 7 executes a signal process on a signal supplied sequentially from each column signal processing circuit 5 through the horizontal signal line 10 and outputs the signal.

An input/output terminal 12 exchanges a signal with the outside.

FIG. 2 illustrates a cross-sectional view of one pixel 2 of the solid-state imaging device 1 of FIG. 1.

The solid-state imaging device according to this embodiment has a so-called back surface radiation type structure in which light is made to be incident from the side opposite to a circuit or a wiring line to the semiconductor substrate in which a light receiving unit is formed.

In this embodiment, as illustrated in FIG. 2, two photoelectric conversion units PD1 and PD2 stacked in a depth direction of the semiconductor substrate 11 are formed in one pixel.

Each of the photoelectric conversion units PD1 and PD2 is composed of a photodiode formed in the semiconductor substrate 11.

In addition, a light reception surface on which light is incident is formed at the side of a back surface 16 of the semiconductor substrate 11.

Meanwhile, although not illustrated in the drawings, a circuit including a so-called read circuit and the like is formed at the side of a surface 15 of the semiconductor substrate 11.

The first photoelectric conversion unit PD1 of the side of the back surface 16 of the semiconductor substrate 11 in the two photoelectric conversion units PD1 and PD2 executes photoelectric conversion on blue B light having a short wavelength. The second photoelectric conversion unit PD2 of the side of the surface 15 executes photoelectric conversion on read R light having a long wavelength. Thereby, a longitudinal spectroscopic image sensor is configured.

In the second photoelectric conversion unit PD2 of the side of the surface 15 of the semiconductor substrate 11, a floating diffusion (FD) 24 is provided at the left side through a transfer gate 23.

In this embodiment, particularly, a longitudinal transistor Tr1 is connected to the first photoelectric conversion unit PD1 of the side of the back surface 16 of the semiconductor substrate 11.

The longitudinal transistor Tr1 is configured to have a gate electrode 21 formed to be embedded to an inner portion of the semiconductor substrate 11 from the side of the surface 15 of the semiconductor substrate 11.

Thereby, the first photoelectric conversion unit PD1 is connected to a channel formed by the longitudinal transistor Tr1.

In addition, a floating diffusion (FD) 22 is provided in the surface 15 of the semiconductor substrate 11 of the right side of the gate electrode 21 of the longitudinal transistor Tr1.

In addition, the first photoelectric conversion unit PD1 is formed over the side of the back surface 16 of a portion 21A of the gate electrode 21 of the longitudinal transistor Tr1 embedded in the semiconductor substrate 11.

In addition, a light shielding film 25 is formed to cover a portion of the back surface (light incident surface) 16 of the semiconductor substrate 11 in which the first photoelectric conversion unit PD1 is not formed.

Here, a solid-state imaging device having a structure according to the related art in which a plurality of photoelectric conversion units are stacked in a semiconductor substrate will be described with reference to FIGS. 10A and 10B and 11, for comparison with the present technique.

Figure 10:
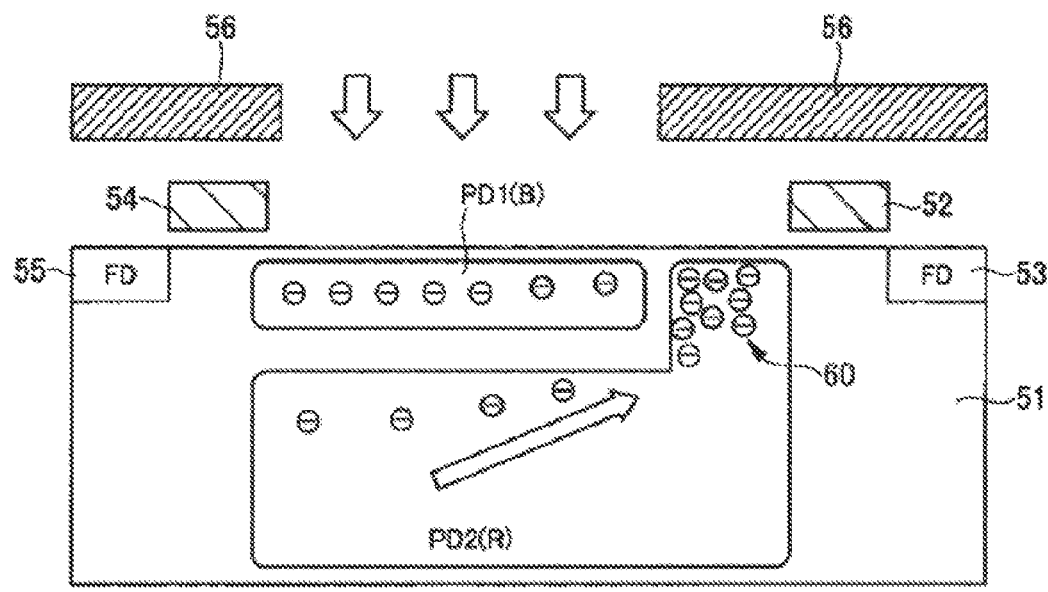
FIGS. 10A and 10B are cross-sectional views of a structure according to the related art in which a plurality of photoelectric conversion units are stacked in a semiconductor substrate.
Figure 10:
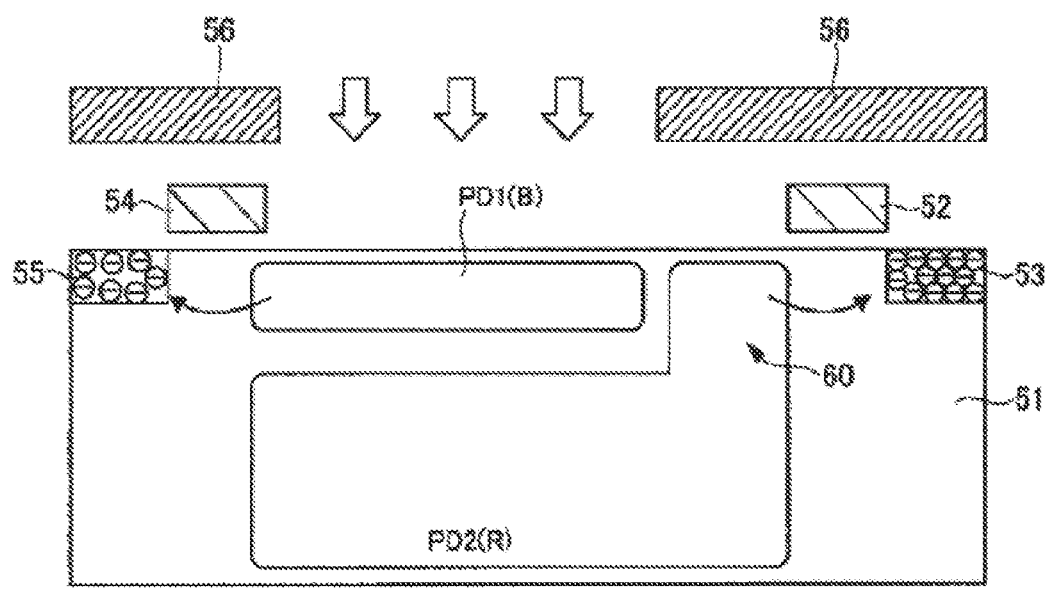

Cross-sectional views of the solid-state imaging device having the structure according to the related art are illustrated in FIGS. 10A and 10B.

As illustrated in FIG. 10A, in the solid-state imaging device, an implantation plug 60 formed to extend in a vertical direction of a semiconductor substrate 51 is used in charge transferring from a second photoelectric conversion unit PD2 for red R formed in a deep place of the semiconductor substrate 51.

The implantation plug 60 is configured by an impurity region formed to extend in the vertical direction of the semiconductor substrate 51 continuously from an impurity region of the second photoelectric conversion unit PD2, by ion implantation of impurity.

In addition, the charge obtained by the second photoelectric conversion unit PD2 passes through the implantation plug 60 and is accumulated in a portion where reading is enabled at a field of a transfer gate 52 on a surface of the semiconductor substrate 51.

Meanwhile, a transfer gate 54 on the surface of the semiconductor substrate 51 is used in charge transferring from a first photoelectric conversion unit PD1 for blue B formed in a shallow place of the semiconductor substrate 51.

In addition, a light shielding film 56 is formed above the semiconductor substrate 51 to cover a portion other than the first photoelectric conversion unit PD1.

Next, an operation when the charge is read is illustrated in FIG. 10B.

When the charge is read, the left transfer gate 54 is turned on and the charge of the first photoelectric conversion unit PD1 is read to a left floating diffusion (FD) 55, as shown by an arrow in FIG. 10B.

In addition, the right transfer gate 52 is turned on and the charge of the implantation plug 60 of the second photoelectric conversion unit PD2 is read to a right floating diffusion (FD) 53, as shown by an arrow in FIG. 10B.

Because the implantation plug 60 is formed to extend from the deep place to the shallow place of the semiconductor substrate 51, as the implantation plug 60 advances toward the shallow place, a wavelength of light to be absorbed becomes short.

For this reason, if light leaks into the implantation plug 60 during the charge accumulation, a signal of the photoelectric conversion unit PD2 of red R may be mixed with a signal of a short wavelength of blue or the like.

Therefore, an upper side of the implantation plug 60 is covered with the light shielding film 56 to perform superior color separation.

However, if the size of the solid-state imaging element decreases or the number of pixels of the solid-state imaging element increases and a pixel size decreases, an amount of light to be obliquely incident increases.

Figure 11:
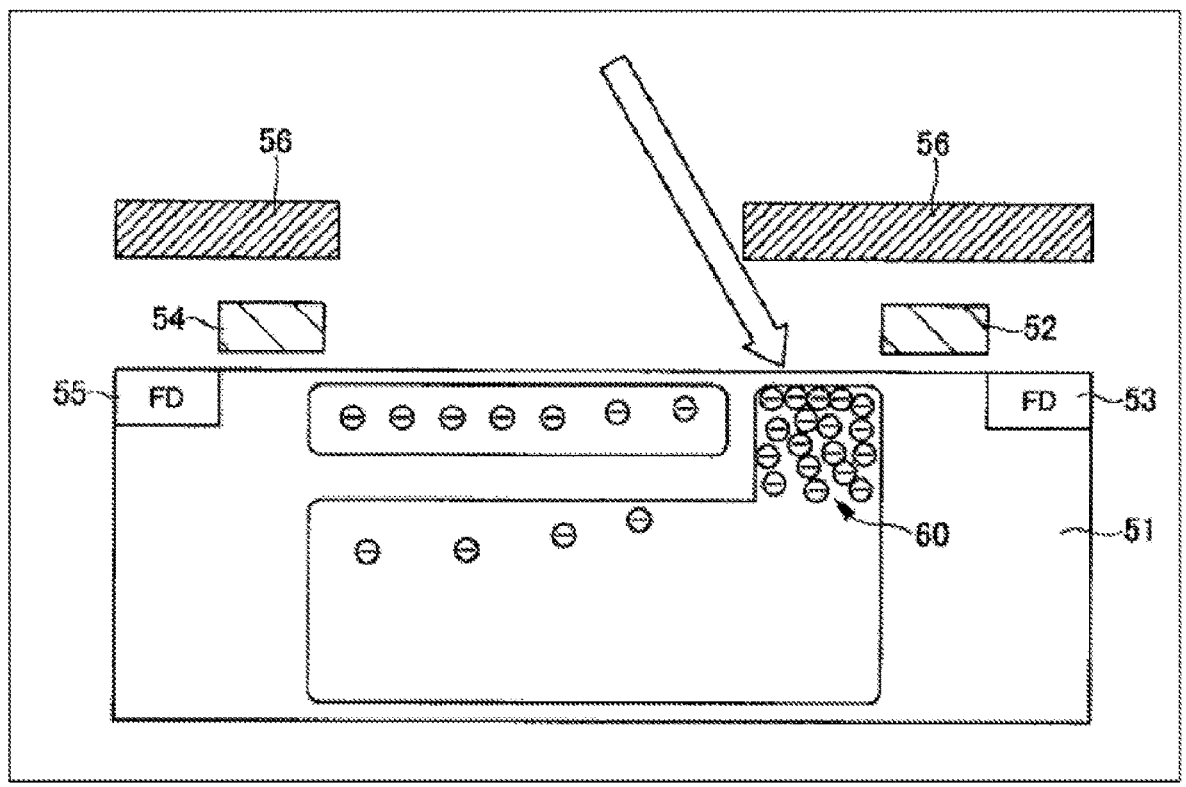
FIG. 11 is a diagram illustrating the case in which light is obliquely incident in a configuration of FIG. 10A.

If the amount of light to be obliquely incident increases, as illustrated in FIG. 11, the light to be obliquely incident is incident on the implantation plug 60 of the lower side of the light shielding film 56 and the charge generated from the red R light and the charge generated from the blue B light or the like having the short wavelength may be mixed in the implantation plug 60. Thereby, color mixture is generated in the signal charge and a color separation characteristic is degraded.

In addition, because the light shielding film 56 is formed to cover the upper side of the implantation plug 60, an opening of the light shielding film 56 is narrowed by an amount corresponding to the implantation plug 60 and an aperture ratio decreases. According to the decrease in the aperture ratio, sensitivity decreases.

In the structure according to the related art illustrated in FIGS. 10A and 10B and 11, the implantation plug 60 is formed from the second photoelectric conversion unit PD2 formed in the deep place of the semiconductor substrate 51 to the vicinity of the surface of the semiconductor substrate 51 and a structure having a different absorption wavelength band is connected. For this reason, it is necessary to form the light shielding film 56 becoming the cause of the decrease in the aperture ratio on the implantation plug 60.

Meanwhile, in the structure according to this embodiment, the charge generated in the first photoelectric conversion unit PD1 formed in the deep place of the semiconductor substrate 11 is read by the longitudinal transistor Tr1.

Because the structure according to this embodiment is a back surface radiation type structure, the first photoelectric conversion unit PD1 formed at the side of the back surface (light incident surface) 16 of the semiconductor substrate 11 is formed at the side opposite to the surface 15 to be a circuit formation surface.

Because a transfer gate is not provided at the side of the back surface 16 to be the light incident surface, a ratio of an opening width with respect to the aperture ratio, that is, the pixel size can be maximized by forming the first photoelectric conversion unit PD1 widely. Thereby, the sensitivity can be maximized.

In addition, an area of the second photoelectric conversion unit PD2 formed at the side of the surface 15 of the semiconductor substrate 11 can be increased, because the implantation plug 60 of the structure according to the related art is not provided.

In addition, because the longitudinal transistor Tr1 is used in reading, the depth of the first photoelectric conversion unit PD1 formed in the deep portion of the semiconductor substrate 11 can be made to be constant and the first photoelectric conversion unit PD1 can only have a constant wavelength absorption band. Thereby, the color mixture that is generated by the implantation plug 60 of the structure according to the related art illustrated in FIGS. 10A and 10B can be prevented from being generated.

However, in actuality, during a charge transfer period during which the charge is transferred to the floating diffusion 21 using the longitudinal transistor Tr1, the first photoelectric conversion unit PD1 formed in the deep portion of the semiconductor substrate 11 and the channel portion formed around the longitudinal transistor Tr1 are connected. For this reason, during the charge transfer period, photoelectric conversion components of portions having the different depths in the semiconductor substrate 11 are added, similarly to the structure according to the related art.

However, because the charge transfer period during which the longitudinal transistor Tr1 is turned on is sufficiently shorter than the charge accumulation period, a mixture color component during the charge transfer period can be ignored.

During the charge accumulation period, the longitudinal transistor Tr1 is turned off and the channel is not formed around the first photoelectric conversion unit PD1 and the longitudinal transistor Tr1. Therefore, the photoelectric conversion components of the portions having the different depths in the semiconductor substrate 11 are not added.

In addition, the longitudinal transistor Tr1 is used, so that the photoelectric conversion unit can be extended to a region not helpful for the photoelectric conversion by the formation of the implantation plug 60 in the structure according to the related art illustrated in FIGS. 10A and 10B.

In addition, because it is not necessary to form the light shielding film 25 to suppress the color mixture in the portion of the longitudinal transistor Tr1, the aperture ratio can be improved.

According to the configuration of the solid-state imaging device according to this embodiment described above, the signal charge on which the photoelectric conversion has been executed by the first photoelectric conversion unit PD1 formed at the side of the back surface 16 of the semiconductor substrate 11 is read using the longitudinal transistor Tr1.

Thereby, during the charge accumulation period during which the longitudinal transistor Tr1 is turned off, because the channel is not formed around the first photoelectric conversion unit PD1 and the longitudinal transistor Tr1, the signal charge by the light having the different wavelengths is not mixed. That is, the color mixture is not generated.

In addition, because the color mixture is not generated even though the portion of the gate electrode 21 of the longitudinal transistor Tr1 is not covered with the light shielding film 25, the sensitivity can be improved by increasing the aperture ratio of the light shielding film 25.

In addition, the first photoelectric conversion unit PD1 is formed over the side of the back surface 16 of the portion 21A of the gate electrode 21 of the longitudinal transistor Tr1 embedded in the semiconductor substrate 11.

Thereby, as compared with the structure in which the implantation plug is formed, the sensitivity can be improved by increasing the area of the first photoelectric conversion unit PD1.

Therefore, because the color mixture is not generated by the configuration according to this embodiment, a solid-state imaging device having superior color separation and high sensitivity can be realized.

2. Second Embodiment (Solid-State Imaging Device)

Figure 3:
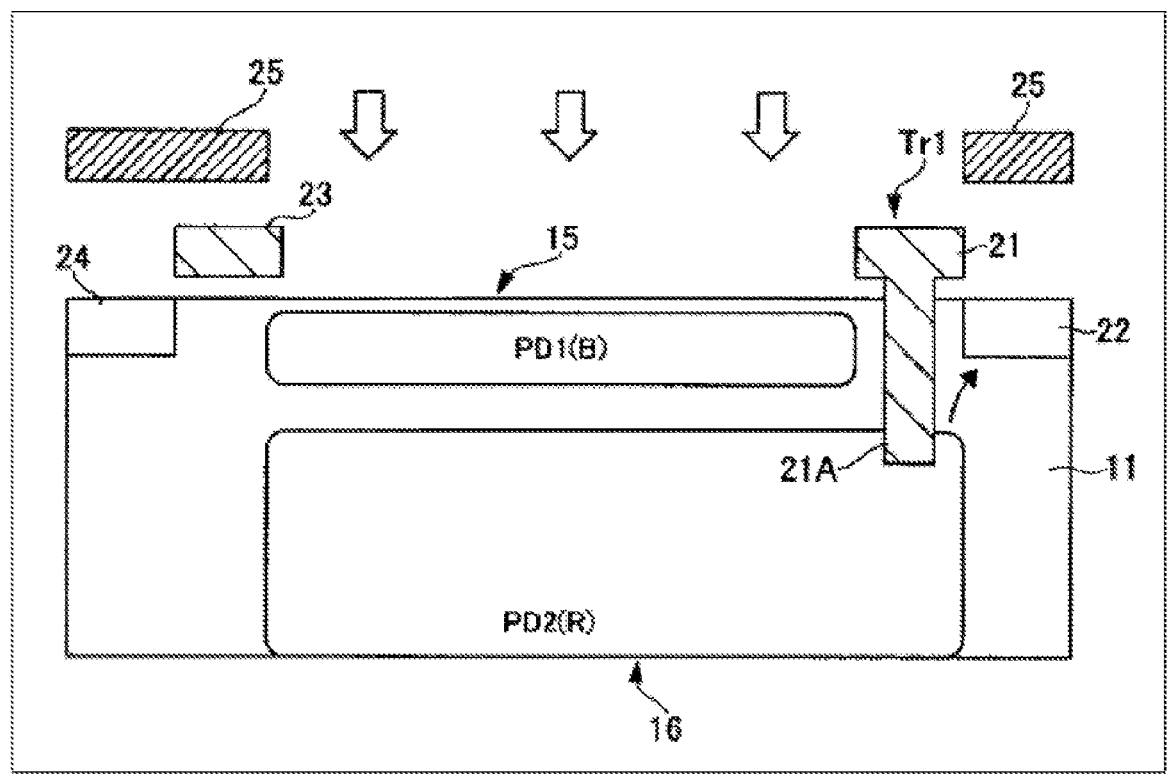
FIG. 3 is a cross-sectional view of a main portion of a solid-state imaging device according to a second embodiment.

A schematic structural view (a cross-sectional view of a main portion) of a solid-state imaging device according to a second embodiment is illustrated in FIG. 3. FIG. 3 illustrates a cross-sectional view of one pixel of the solid-state imaging device, similarly to FIG. 2.

In the solid-state imaging device according to this embodiment, a structure of a solid-state imaging element is set as a so-called surface radiation type structure in which light is made to be incident from the same side as a circuit or a wiring line to a semiconductor substrate in which a light receiving unit is formed.

In this embodiment, as illustrated in FIG. 3, a first photoelectric conversion unit PD1 to execute photoelectric conversion on blue B light is formed in a portion of the side of a surface 15 in a semiconductor substrate 11 and a second photoelectric conversion unit PD2 to execute photoelectric conversion on red R light is formed in a portion of the side of a back surface 16 in the semiconductor substrate 11. That is, an array of the first photoelectric conversion unit PD1 and the second photoelectric conversion unit PD2 at the side of the surface 15 and the side of the back surface 16 of the semiconductor substrate 11 is opposite to the case of FIG. 2.

In addition, a light reception surface on which light is incident is formed at the side of the surface 15 of the semiconductor substrate 11.

In addition, although not illustrated in the drawings, a circuit including a so-called read circuit and the like is formed at the side of the surface 15 of the semiconductor substrate 11.

In the first photoelectric conversion unit PD1 of the side of the surface 15 of the semiconductor substrate 11, a floating diffusion (FD) 24 is provided at the left side through a transfer gate 23.

In this embodiment, particularly, a longitudinal transistor Tr1 is connected to the second photoelectric conversion unit PD2 of the side of the back surface 16 of the semiconductor substrate 11.

The longitudinal transistor Tr1 is configured to have a gate electrode 21 formed to be embedded to an inner portion of the semiconductor substrate 11 from the side of the surface 15 of the semiconductor substrate 11.

Thereby, the second photoelectric conversion unit PD2 is connected to a channel formed by the longitudinal transistor Tr1.

In addition, a floating diffusion (FD) 22 is provided in the surface 15 of the semiconductor substrate 11 of the right side of the gate electrode 21 of the longitudinal transistor Tr1.

In addition, the second photoelectric conversion unit PD2 is formed over the side of the back surface 16 of a portion 21A of the gate electrode 21 of the longitudinal transistor Tr1 embedded in the semiconductor substrate 11.

In addition, a light shielding film 25 is formed to cover a portion of the surface (a light incident surface and a circuit formation surface) 15 of the semiconductor substrate 11 in which the first photoelectric conversion unit PD1 is not formed.

In the structure according to this embodiment, the charge generated in the second photoelectric conversion unit PD2 formed in a deep place of the semiconductor substrate 11 is read by the longitudinal transistor Tr1.

By this structure, areas of the first photoelectric conversion unit PD1 and the second photoelectric conversion unit PD2 can be increased as compared with the structure according to the related art illustrated in FIGS. 10A and 10B.

That is, because the implantation plug 60 of the structure according to the related art illustrated in FIGS. 10A and 10B is not provided, a region of the first photoelectric conversion unit PD1 formed at the side of the surface 15 of the semiconductor substrate 11 can be increased and an area thereof can be increased, as compared with the structure according to the related art.

Meanwhile, the second photoelectric conversion unit PD2 formed at the side of the back surface 16 is formed over the side of the back surface 16 of the portion 21A of the gate electrode 21 of the longitudinal transistor Tr1 embedded in the semiconductor substrate 11 and is extended to almost the same area as an opening of the light shielding film 25. Thereby, a ratio of a width of the photoelectric conversion unit with respect to a pixel size can be maximized and high sensitivity can be obtained.

The other configuration is the same as the configuration of the first embodiment and the structure illustrated in the plan view of FIG. 1 can be adopted.

According to the configuration of the solid-state imaging device according to this embodiment described above, the signal charge on which the photoelectric conversion has been executed by the second photoelectric conversion unit PD2 formed at the side of the back surface 16 of the semiconductor substrate 11 is read using the longitudinal transistor Tr1.

Thereby, during a charge accumulation period during which the longitudinal transistor Tr1 is turned off, because a channel is not formed around the second photoelectric conversion unit PD2 and the longitudinal transistor Tr1, the color mixture is not generated.

In addition, because the color mixture is not generated even though the portion of the gate electrode 21 of the longitudinal transistor Tr1 is not covered with the light shielding film 25, the sensitivity can be improved by increasing the aperture ratio of the light shielding film 25.

In addition, the second photoelectric conversion unit PD2 is formed over the side of the back surface 16 of the portion 21A of the gate electrode 21 of the longitudinal transistor Tr1 embedded in the semiconductor substrate 11.

Thereby, as compared with the structure in which the implantation plug is formed, the sensitivity can be improved by increasing the area of the second photoelectric conversion unit PD2.

Therefore, because the color mixture is not generated by the configuration according to this embodiment, a solid-state imaging device having superior color separation and high sensitivity can be realized.

3. Third Embodiment (Solid-State Imaging Device)

Figure 4:
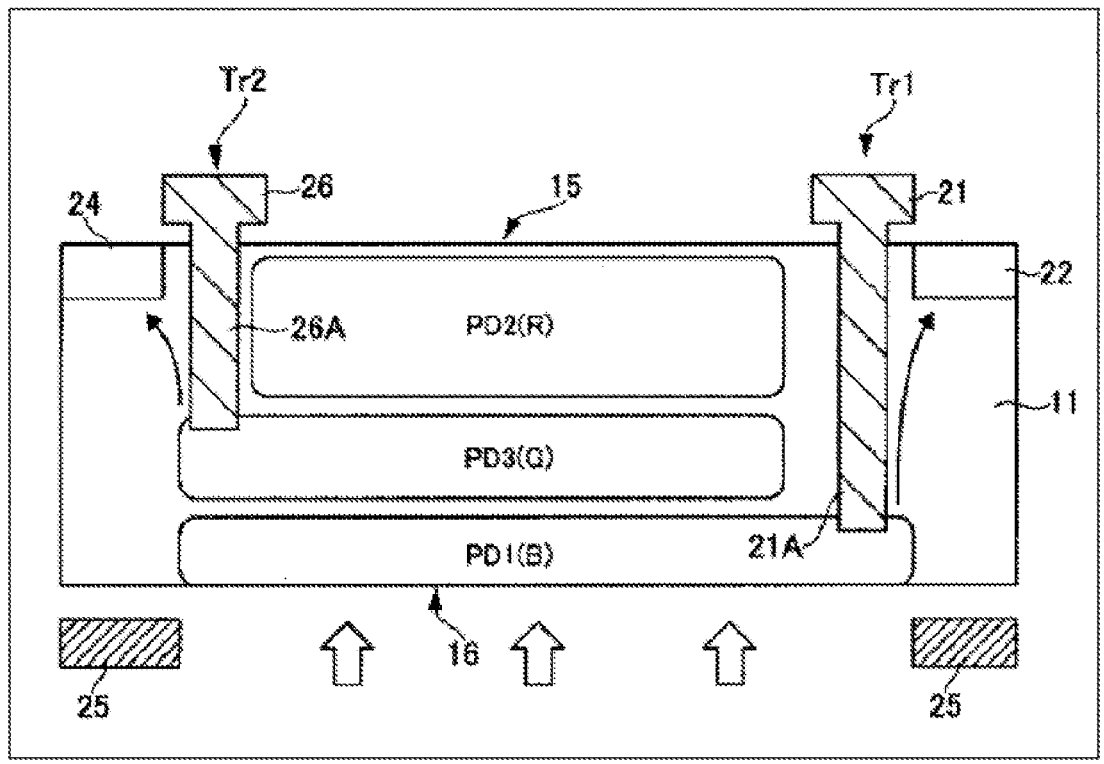
FIG. 4 is a cross-sectional view of a main portion of a solid-state imaging device according to a third embodiment.

A schematic structural view (a cross-sectional view of a main portion) of a solid-state imaging device according to a third embodiment is illustrated in FIG. 4. FIG. 4 illustrates a cross-sectional view of one pixel of the solid-state imaging device, similarly to FIGS. 2 and 3.

The solid-state imaging device according to this embodiment has a back surface radiation type structure in which photoelectric conversion units of three layers are stacked in a semiconductor substrate.

In this embodiment, as illustrated in FIG. 4, the photoelectric conversion units of the three layers are stacked from the side of a back surface (light incident surface) 16 of a semiconductor substrate 11 and a third photoelectric conversion unit PD3 of green G is provided between the two photoelectric conversion units PD1 and PD2 according to the first embodiment.

Similarly to the first embodiment, a longitudinal transistor Tr1 is used in reading the charge from the first photoelectric conversion unit PD1.

In this embodiment, a second longitudinal transistor Tr2 is used in charge reading from the third photoelectric conversion unit PD3. That is, the third photoelectric conversion unit PD3 is connected to a channel formed by the second longitudinal transistor Tr2.

The length of a portion 26A of a gate electrode 26 of the second longitudinal transistor Tr2 to be embedded in a semiconductor substrate 11 is shorter than the length of a portion 21A of a gate electrode 21 of the first longitudinal transistor Tr1 to be embedded in the semiconductor substrate 11.

In addition, a transfer gate formed on a portion not illustrated in the drawings on a surface 15 of the semiconductor substrate 11 is used in charge reading from the second photoelectric conversion unit PD2. The transfer gate has the same configuration as the transfer gate 23 of FIG. 2 and reads the signal charge from the second photoelectric conversion unit PD2 to a floating diffusion (FD) not illustrated in the drawings.

The third photoelectric conversion unit PD3 is formed over the side of the back surface 16 of the portion 26A of the gate electrode 26 of the second longitudinal transistor Tr2 embedded in the semiconductor substrate.

The first photoelectric conversion unit PD1 is formed from the side of the back surface 16 of the portion 26A of the gate electrode 26 of the second longitudinal transistor Tr2 embedded in the semiconductor substrate to the side of the back surface 16 of the portion 21A of the gate electrode 21 of the longitudinal transistor Tr1 embedded in the semiconductor substrate 11.

Because the other configuration is the same as the configuration of the first embodiment illustrated in FIGS. 1 and 2, overlapped description is omitted.

According to the configuration of the solid-state imaging device according to this embodiment described above, the signal charge on which the photoelectric conversion has been executed by the first photoelectric conversion unit PD1 and the third photoelectric conversion unit PD3 formed in the semiconductor substrate 11 is read using the longitudinal transistors Tr1 and Tr2.

Thereby, during a charge accumulation period during which the longitudinal transistors Tr1 and Tr2 are turned off, because a channel is not formed around the first photoelectric conversion unit PD1 or the third photoelectric conversion unit PD3 and the longitudinal transistor Tr1, the color mixture is not generated.

In addition, because the color mixture is not generated even though the portion of the gate electrode 21 of the longitudinal transistor Tr1 is not covered with a light shielding film 25, sensitivity can be improved by increasing an aperture ratio of the light shielding film 25.

In addition, the first photoelectric conversion unit PD1 is formed over the side of the back surface 16 of the portion 21A of the gate electrode 21 of the longitudinal transistor Tr1 embedded in the semiconductor substrate 11. In addition, the third photoelectric conversion unit PD3 is formed over the side of the back surface 16 of the portion 26A of the gate electrode 26 of the second longitudinal transistor Tr2 embedded in the semiconductor substrate 11.

Thereby, as compared with the structure in which the implantation plug is formed, the sensitivity can be improved by increasing the areas of the first photoelectric conversion unit PD1 and the third photoelectric conversion unit PD3.

Therefore, because the color mixture is not generated by the configuration according to this embodiment, a solid-state imaging device having superior color separation and high sensitivity can be realized.

4. Fourth Embodiment (Solid-State Imaging Device)

Figure 5:
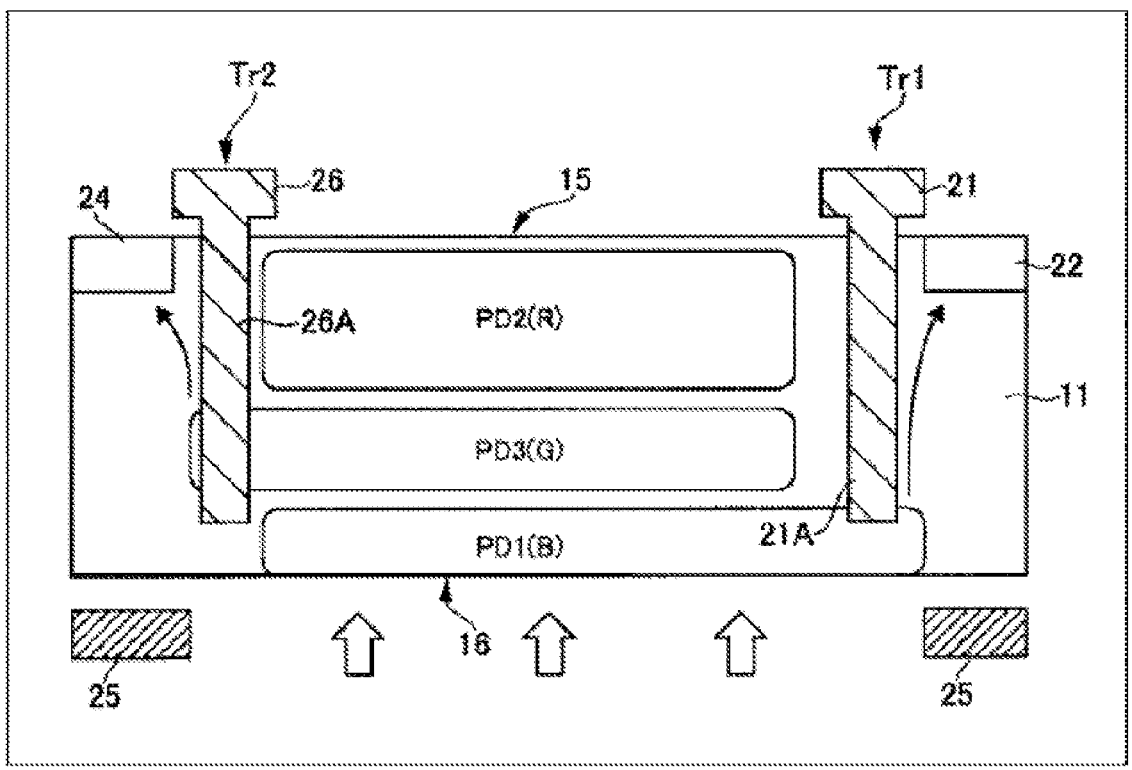
FIG. 5 is a cross-sectional view of a main portion of a solid-state imaging device according to a fourth embodiment.

A schematic structural view (a cross-sectional view of a main portion) of a solid-state imaging device according to a fourth embodiment is illustrated in FIG. 5. FIG. 5 illustrates a cross-sectional view of one pixel of the solid-state imaging device, similarly to FIGS. 2 to 4.

The solid-state imaging device according to this embodiment has a back surface radiation type structure in which photoelectric conversion units of three layers are stacked in a semiconductor substrate, similarly to the third embodiment illustrated in FIG. 4.

In this embodiment, almost an entire portion has the same configuration as the configuration of the third embodiment illustrated in FIG. 4. However, a partial configuration is different from the configuration of the third embodiment.

That is, in this embodiment, as illustrated in FIG. 5, the length of a portion 26A of a gate electrode 26 of a second longitudinal transistor Tr2 embedded in a semiconductor substrate 11 is almost the same as the length of a portion 21A of a gate electrode 21 of a first longitudinal transistor Tr1 embedded in the semiconductor substrate 11.

In addition, a first photoelectric conversion unit PD1 is formed not to overlap the portion 26A of the gate electrode 26 of the second longitudinal transistor Tr2 embedded in the semiconductor substrate 11.

According to the configuration of the solid-state imaging device according to this embodiment described above, the signal charge on which the photoelectric conversion has been executed by the first photoelectric conversion unit PD1 and a third photoelectric conversion unit PD3 formed in the semiconductor substrate 11 is read using the longitudinal transistors Tr1 and Tr2.

Thereby, during a charge accumulation period during which the longitudinal transistors Tr1 and Tr2 are turned off, because a channel is not formed around the first photoelectric conversion unit PD1 or the third photoelectric conversion unit PD3 and the longitudinal transistor Tr1, the color mixture is not generated.

In addition, because the color mixture is not generated even though the portion of the gate electrode 21 of the longitudinal transistor Tr1 is not covered with a light shielding film 25, sensitivity can be improved by increasing an aperture ratio of the light shielding film 25.

In addition, the first photoelectric conversion unit PD1 is formed over the side of a back surface 16 of the portion 21A of the gate electrode 21 of the longitudinal transistor Tr1 embedded in the semiconductor substrate 11. In addition, the third photoelectric conversion unit PD3 is formed over the portion 26A of the gate electrode 26 of the second longitudinal transistor Tr2 embedded in the semiconductor substrate 11.

Thereby, as compared with the structure in which the implantation plug is formed, the sensitivity can be improved by increasing the areas of the first photoelectric conversion unit PD1 and the third photoelectric conversion unit PD3.

Therefore, because the color mixture is not generated by the configuration according to this embodiment, a solid-state imaging device having superior color separation and high sensitivity can be realized.

Here, if the configuration of the third embodiment and the configuration of the fourth embodiment are compared with each other, advantages of the configurations are as follows.

In the third embodiment, because the area of the first photoelectric conversion unit PD1 is large, sensitivity of read R light can be improved.

In the fourth embodiment, because the depths of the gate electrodes 21 and 26 of the two longitudinal transistors Tr1 and Tr2 in the semiconductor substrate are almost the same, holes to bury the gate electrodes 21 and 26 in the semiconductor substrate 11 can be simultaneously formed. Thereby, it is necessary to sequentially form the holes having the different depths in the semiconductor substrate 11. As compared with the structure of the third embodiment, the number of manufacturing processes can be decreased.

The configuration in which the photoelectric conversion units of the three layers are stacked in the semiconductor substrate is not limited to the back surface radiation type structure like the third embodiment or the fourth embodiment and can be applied to a surface radiation type structure.

5. Fifth Embodiment (Solid-State Imaging Device)

Figure 6:
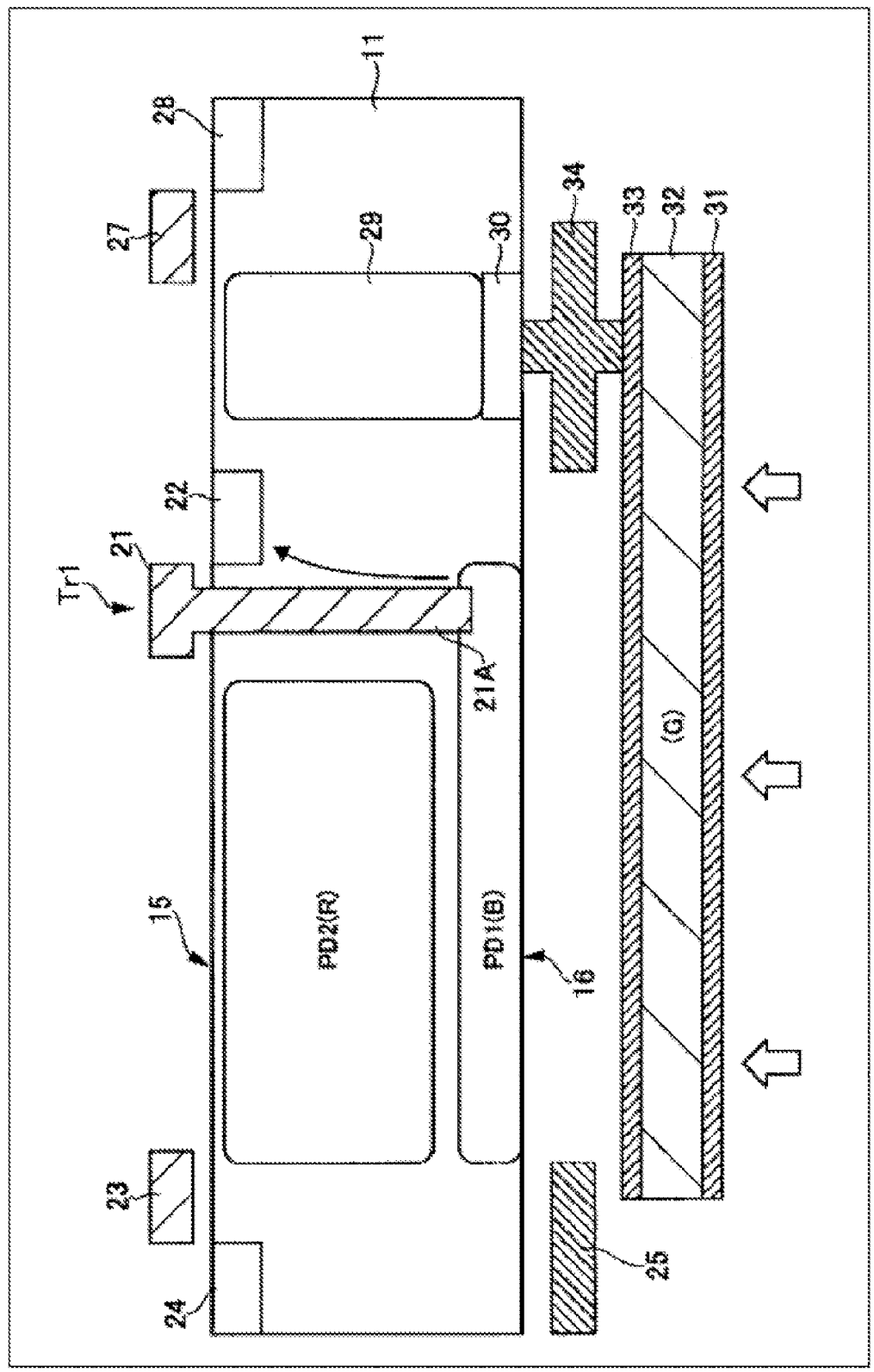
FIG. 6 is a cross-sectional view of a main portion of a solid-state imaging device according to a fifth embodiment.

A schematic structural view (a cross-sectional view of a main portion) of a solid-state imaging device according to a fifth embodiment is illustrated in FIG. 6. FIG. 6 illustrates a cross-sectional view of one pixel of the solid-state imaging device, similarly to FIGS. 2 to 5.

The solid-state imaging device according to this embodiment has a combination configuration of a structure in which photoelectric conversion units of two layers are stacked in a semiconductor substrate and the charge is read using a longitudinal transistor and a stacked type photoelectric conversion layer having a color filter function and a photoelectric conversion function arranged at the side of a light incident surface.

In this embodiment, as illustrated in FIG. 6, a first photoelectric conversion unit PD1 and a second photoelectric conversion unit PD2 are formed in a semiconductor substrate 11 and a gate electrode 21 of a longitudinal transistor Tr1 is formed to be embedded in the semiconductor substrate 11 from the side of a surface 15 of the semiconductor substrate 11.

In addition, the first photoelectric conversion unit PD1 of blue B is formed at the side of a back surface 16 of the semiconductor substrate 11 and the second photoelectric conversion unit PD2 of red R is formed at the side of the surface 15 of the semiconductor substrate 11.

The first photoelectric conversion unit PD1 is formed over the side of the back surface 16 of a portion 21A of the gate electrode 21 of the longitudinal transistor Tr1 embedded in the semiconductor substrate 11.

This configuration is almost the same as the configuration according to the first embodiment illustrated in FIG. 2.

In this embodiment, one organic photoelectric conversion unit that receives green G light and detects the light is provided at the side of the back surface 16 of the semiconductor substrate 11.

The organic photoelectric conversion unit is configured by sandwiching an organic photoelectric conversion layer 32 made of an organic photoelectric conversion material between a first electrode 31 of the light incident side and a second electrode 33 of the side of the semiconductor substrate 11.

The organic photoelectric conversion layer 32 has a function of a color filter that absorbs green G light, executes photoelectric conversion, and transmits blue B and red R light.

The first electrode 31 and the second electrode 33 are formed of a transparent conductive material.

As the transparent conductive material of the first electrode 31 and the second electrode 33, for example, indium tin oxide (ITO), indium zinc oxide, and the like can be used.

As an organic photoelectric conversion material of the organic photoelectric conversion layer 32 that executes photoelectric conversion with green G light, for example, organic photoelectric conversion materials including a rhodamine pigment, a merocyanine pigment, quinacridone, and the like can be used.

The second electrode 33 of the organic photoelectric conversion unit is electrically connected to the semiconductor substrate 11 through a wiring layer 34 having a section of a cross shape.

In a portion of the side of the back surface 16 of the semiconductor substrate 11 connected to the wiring layer 34, a contact region 30 is formed.

In addition, a charge accumulation region 29 is formed in the semiconductor substrate 11 to be connected to the contact region 30.

The charge on which the photoelectric conversion has been executed by the organic photoelectric conversion layer 32 passes the contact region 30 via the second electrode 33 and the wiring layer 34 and is accumulated in the charge accumulation region 29 in the semiconductor substrate 11.

The charge that is accumulated in the charge accumulation region 29 is read to a floating diffusion (FD) 28 formed at the side of the surface 15 of the semiconductor substrate 11, by a transfer gate 27.

The wiring layer 34 is preferably formed of a metal material having a light shielding property such as tungsten, such that the wiring layer 34 functions as a light shielding film for the charge accumulation region 29.

The organic photoelectric conversion layer 32 of the organic photoelectric conversion unit is formed to include a portion of the side of the back surface 16 of the gate electrode 21 of the longitudinal transistor Tr1 and a portion of the side of the back surface 16 of the charge accumulation region 29 and have an area larger than the area of the first photoelectric conversion unit PD1. Thereby, as compared with the configuration in which the organic photoelectric conversion layer is formed to have almost the same area as the area of the photoelectric conversion unit in the semiconductor substrate, sensitivity of green G light in the organic photoelectric conversion layer 32 can be improved.

According to the configuration of the solid-state imaging device according to this embodiment described above, the signal charge on which the photoelectric conversion has been executed by the first photoelectric conversion unit PD1 formed at the side of the back surface 16 of the semiconductor substrate 11 is read using the longitudinal transistor Tr1.

Thereby, during a charge accumulation period during which the longitudinal transistor Tr1 is turned off, because a channel is not formed around the first photoelectric conversion unit PD1 and the longitudinal transistor Tr1, the color mixture is not generated.

In addition, the first photoelectric conversion unit PD1 is formed over the side of the back surface 16 of the portion 21A of the gate electrode 21 of the longitudinal transistor Tr1 embedded in the semiconductor substrate 11.

Thereby, as compared with the structure in which the implantation plug is formed, the sensitivity can be improved by increasing the area of the first photoelectric conversion unit PD1.

In addition, the organic photoelectric conversion layer 32 of the organic photoelectric conversion unit is formed to have the area larger than the area of the first photoelectric conversion unit PD1. Thereby, as compared with the configuration in which the organic photoelectric conversion layer is formed to have almost the same area as the area of the first photoelectric conversion unit, sensitivity of green G light in the organic photoelectric conversion layer 32 can be improved.

Therefore, because the color mixture is not generated by the configuration according to this embodiment, a solid-state imaging device having superior color separation and high sensitivity can be realized.

In the embodiment described above, as the combination of the colors, the organic photoelectric conversion unit is set as green G, the first photoelectric conversion unit is set as blue B, and the second photoelectric conversion unit is set as red R. However, other color combinations can be used.

For example, the organic photoelectric conversion unit can be set as red R or blue B and the two photoelectric conversion units in the semiconductor substrate can be set as other corresponding colors.

As the organic photoelectric conversion material to execute the photoelectric conversion with red R light, organic photoelectric conversion materials including a phthalocyanine pigment can be used.

As the organic photoelectric conversion material to execute the photoelectric conversion with blue B light, organic photoelectric conversion materials including a coumarin pigment, a merocyanine pigment, and the like can be used.

In addition, a combination of the organic photoelectric conversion layer and the photoelectric conversion unit according to the present technique can be applied to a surface radiation type structure.

In this case, as the photoelectric conversion units formed in the semiconductor substrate, the first photoelectric conversion unit PD1 of the blue B and the second photoelectric conversion unit PD2 of the red R are arranged from the side of the light incident surface and the charge generated in the second photoelectric conversion unit PD2 of the red R is read using the longitudinal transistor, similarly to the second embodiment.

6. Sixth Embodiment (Solid-State Imaging Device)

A schematic structural view (a cross-sectional view of a main portion) of a solid-state imaging device according to a sixth embodiment is illustrated in FIG. 7. FIG. 7 illustrates a cross-sectional view of two adjacent pixels of the solid-state imaging device.

The solid-state imaging device according to this embodiment has a combination configuration of a structure in which photoelectric conversion units of two layers are stacked in a semiconductor substrate and the charge is read using a longitudinal transistor and a structure in which a photoelectric conversion unit of one layer is formed in the semiconductor substrate according to the related art and the charge is read using a transfer gate.

In this embodiment, as illustrated in FIG. 7, a first photoelectric conversion unit PD1 and a second photoelectric conversion unit PD2 are formed in a semiconductor substrate 11 and a gate electrode 21 of a longitudinal transistor Tr1 is formed to be embedded in the semiconductor substrate 11 from the side of a surface 15 of the semiconductor substrate 11.

In addition, the first photoelectric conversion unit PD1 of blue B is formed at the side of a back surface 16 of the semiconductor substrate 11 and the second photoelectric conversion unit PD2 of red R is formed at the side of the surface 15 of the semiconductor substrate 11.

The first photoelectric conversion unit PD1 is also formed over the side of the back surface 16 of a portion 21A of the gate electrode 21 of the longitudinal transistor Tr1 embedded in the semiconductor substrate 11.

In addition, a light shielding film 25 is formed to cover a portion other than the first photoelectric conversion unit PD1 of the side of the back surface 16 of the semiconductor substrate 11.

This configuration is almost the same as the configuration according to the first embodiment illustrated in FIG. 2.

In this embodiment, in a first pixel in which the first photoelectric conversion unit PD1 and the second photoelectric conversion unit PD2 are formed, a color filter 35 of Magenta (Mg) is provided to be closer to the light incident side than the light shielding film 25.

In addition, in a second pixel adjacent to the first pixel, a third photoelectric conversion unit PD3 of green G is formed in the semiconductor substrate 11 and a color filter 36 of green (G) is provided to be closer to the light incident side than the light shielding film 25. In addition, a transfer gate 27 to transfer the charge on which the photoelectric conversion has been executed by the third photoelectric conversion unit PD3 and a floating diffusion (FD) 28 to which the charge transferred by the transfer gate 27 is transferred are provided at the side of a surface 15 of the semiconductor substrate 11.

In addition, a planar array of color filters in this embodiment is illustrated in FIG. 8.

As illustrated in FIG. 8, color filters of magenta (Mg) and color filters of green (G) are arranged in a checkered pattern.

The planar array of the color filters is not limited to a checkered array illustrated in FIG. 8 and other planar array can be used.

In addition, kinds of colors of used color filters are not limited to two kinds of magenta and green and other combination can be used.

According to the configuration of the solid-state imaging device according to this embodiment described above, the signal charge on which the photoelectric conversion has been executed by the first photoelectric conversion unit PD1 formed at the side of the back surface 16 of the semiconductor substrate 11 is read using the longitudinal transistor Tr1.

Thereby, during a charge accumulation period during which the longitudinal transistor Tr1 is turned off, because a channel is not formed around the first photoelectric conversion unit PD1 and the longitudinal transistor Tr1, the color mixture is not generated.

In addition, the first photoelectric conversion unit PD1 is formed over the side of the back surface 16 of the portion 21A of the gate electrode 21 of the longitudinal transistor Tr1 embedded in the semiconductor substrate 11.

Thereby, as compared with the structure in which the implantation plug is formed, the sensitivity can be improved by increasing the area of the first photoelectric conversion unit PD1.

Therefore, because the color mixture is not generated by the configuration according to this embodiment, a solid-state imaging device having superior color separation and high sensitivity can be realized.

7. Modification of Solid-State Imaging Device

In the solid-state imaging device according to the present technique, the configurations of the pixel unit and the peripheral circuit unit are not limited to the configurations illustrated in FIG. 1 and other configurations can be used.

In each embodiment described above, the photoelectric conversion units PD1, PD2, and PD3 composed of the photodiodes are formed in the semiconductor substrate such as the silicon substrate.

In the present technique, the semiconductor layer to form the photoelectric conversion units of the plurality of layers to be stacked is not limited to the semiconductor substrate and a semiconductor substrate in which a semiconductor epitaxial layer is formed, a silicon layer on an oxide film of an SOI substrate, or the like can be used.

In addition, in the present technique, in addition to silicon, a semiconductor such as Ge or a compound semiconductor can be used as a material of the semiconductor layer.

The solid-state imaging device according to the present technique can be applied to a camera system such as a digital camera or a video camera, a mobile phone having an imaging function, and other apparatuses having an imaging function.

8. Seventh Embodiment (Imaging Apparatus)

A schematic structural diagram (block diagram) of an imaging apparatus according to a seventh embodiment is illustrated in FIG. 9.

As illustrated in FIG. 9, an imaging apparatus 121 has a solid-state imaging device 122, an optical system 123, a shutter device 124, a driving circuit 125, and a signal processing circuit 126.

The optical system 123 is composed of an optical lens and the like and forms image light (incident light) from a subject on a pixel unit of the solid-state imaging device 122. Thereby, a signal charge is accumulated in the solid-state imaging device 122 during a constant period. The optical system 123 may be an optical lens system including a plurality of optical lenses.

As the solid-state imaging device 122, the solid-state imaging device according to the present technique such as the solid-state imaging device according to each embodiment described above is used.

The shutter device 124 controls a light radiation period and a light shielding period for the solid-state imaging device 122.

The driving circuit 125 supplies a driving signal to control a transmission operation of the solid-state imaging device 122 and a shutter operation of the shutter device 124. The signal transmission of the solid-state imaging device 122 is performed by the driving signal (timing signal) supplied from the driving circuit 125.

The signal processing circuit 126 executes various signal processes. A video signal on which the signal processes have been executed is stored in a storage medium such as a memory or is output to a monitor.

According to the configuration of the imaging apparatus 121 according to this embodiment described above, the solid-state imaging device according to the present technique such as the solid-state imaging device according to each embodiment described above is used as the solid-state imaging device 122, so that the color mixture can be prevented from being generated and the sensitivity can be improved.

In the present technique, the configuration of the imaging apparatus is not limited to the configuration illustrated in FIG. 9 and any configuration other than the configuration illustrated in FIG. 9 in which the solid-state imaging device according to the present technique is used can be used.

Note that the present disclosure may include the following configurations.

(1) A solid-state imaging device including: a semiconductor layer in which a surface side becomes a circuit formation surface; photoelectric conversion units of two layers or more that are stacked and formed in the semiconductor layer; and a longitudinal transistor in which a gate electrode is formed to be embedded in the semiconductor layer from a surface of the semiconductor layer, wherein the photoelectric conversion unit of one layer in the photoelectric conversion units of the two layers or more is formed over a portion of the gate electrode of the longitudinal transistor embedded in the semiconductor layer and is connected to the channel formed by the longitudinal transistor.

(2) The solid-state imaging device according to (1), wherein the solid-state imaging device has a back surface radiation type structure in which a back surface side of the semiconductor layer becomes a light incident surface.

(3) The solid-state imaging device according to (1) or (2), wherein, during a charge accumulation period, the longitudinal transistor is turned off, the channel of the longitudinal transistor is not formed, and a floating diffusion and the photoelectric conversion units are not connected.

(4) The solid-state imaging device according to any of (1) to (3), wherein the photoelectric conversion units of three layers are stacked in the semiconductor layer and one longitudinal transistor is provided for each of the photoelectric conversion unit of the first layer and the photoelectric conversion unit of the second layer from the back surface side of the semiconductor layer, among the photoelectric conversion units of the three layers.

(5) The solid-state imaging device according to any of (1) to (3), further including: a photoelectric conversion unit that is arranged at a light incident surface side of the semiconductor layer and is configured from an organic photoelectric conversion layer.

(6) The solid-state imaging device according to (5), wherein the organic photoelectric conversion layer is formed over the light incident surface side of the gate electrode of the longitudinal transistor.

(7) The solid-state imaging device according to any of (1) to (3), wherein a first pixel having the photoelectric conversion units of two layers that are stacked and formed and a second pixel having a photoelectric conversion unit to execute photoelectric conversion on light of a color different from colors in the photoelectric conversion units of the two layers of the first pixel are included, a pixel unit is configured by regularly arranging the first pixel and the second pixel two-dimensionally, and color filters having different absorption wavelengths are provided on the first pixel and the second pixel, respectively.

(8) An imaging apparatus including: an optical system; a solid-state imaging device according to any of (1) to (7); and a signal processing circuit that processes an output signal of the solid-state imaging device.

The present technique is not limited to the embodiments described above and other various configurations can be taken without departing from the gist of the present technique.

REFERENCE SIGNS LIST 1, 122 Solid-state imaging device
2 Pixel
3 Pixel unit
4 Vertical driving circuit
5 Column signal processing circuit
6 Horizontal driving circuit 7 Output circuit
8 Control circuit
9 Vertical signal line
10 Horizontal signal line
11 Semiconductor substrate
12 Input/output terminal
15 Surface
16 Back surface
21, 26 Gate electrode
22, 24, 28 Floating diffusion
23, 27 Transfer gate
25 Light shielding film
29 Charge accumulation region
30 Contact region
31 First electrode
32 Organic photoelectric conversion layer
33 Second electrode
34 Wiring layer
35, 36 Color filter
121 Imaging apparatus
123 Optical system
124 Shutter device
125 Driving circuit
126 Signal processing circuit
PD1 First photoelectric conversion unit
PD2 Second photoelectric conversion unit
PD3 Third photoelectric conversion unit
Tr1 Longitudinal transistor
Tr2 Second longitudinal transistor

What is claimed is:

1. A light detecting device, comprising:
a first photoelectric conversion unit disposed above a substrate, the substrate comprising a first surface and a second surface opposite to the first surface, the first surface being disposed between the first photoelectric conversion unit and the second surface, and the first photoelectric conversion unit comprising:
  a first electrode;
  a second electrode disposed between the first electrode and the substrate; and
  a photoelectric conversion layer disposed between the first electrode and the second electrode;
a second photoelectric conversion unit disposed in the substrate, the second photoelectric conversion unit overlapping the first photoelectric conversion unit in a plan view;
a gate electrode, at least a portion of the gate electrode being disposed in the substrate and overlapping the second photoelectric conversion unit in the plan view;
a wiring layer disposed between the first surface of the substrate and the second electrode; and
a first floating diffusion region disposed in the substrate, the first floating diffusion region being disposed at a side of the second surface,
wherein at least a portion of the second photoelectric conversion unit is disposed between the first surface and the gate electrode, and
wherein the first floating diffusion region is configured to receive a charge generated in the photoelectric conversion layer through at least the second electrode and the wiring layer.

2. The light detecting device according to claim 1, wherein the gate electrode is configured to form a channel connected to the second photoelectric conversion unit.

3. The light detecting device according to claim 1, wherein the at least the portion of the gate electrode overlaps the second electrode in a plan view.

4. The light detecting device according to claim 1, wherein the first photoelectric conversion unit is configured to execute photoelectric conversion on light of a first color and the second photoelectric conversion unit is configured to execute photoelectric conversion on light of a second color different than the first color.

5. The light detecting device according to claim 4, wherein the first color is green and the second color is blue or red.

6. The light detecting device according to claim 1, further comprising a wiring layer disposed between the first photoelectric conversion unit and the substrate, wherein the first floating diffusion region is configured to receive the charge generated in the photoelectric conversion layer through the wiring layer.

7. The light detecting device according to claim 1, wherein a planar area of the photoelectric conversion layer is larger than a planar area of the second photoelectric conversion unit.

8. The light detecting device according to claim 1, wherein the at least the portion of the gate electrode contacts the second photoelectric conversion unit.

9. The light detecting device according to claim 1, wherein the photoelectric conversion layer comprises an organic photoelectric conversion material.

10. The light detecting device according to claim 1, further comprising a second floating diffusion region disposed in the substrate, the second floating diffusion region being disposed at a side of the second surface, wherein the second floating diffusion region is configured to receive a charge generated in the second photoelectric conversion unit.

11. The light detecting device according to claim 1, wherein the first floating diffusion region is disposed at the second surface.

12. A light detecting apparatus, comprising:
the light detecting device according to claim 1;
an optical lens; and
a signal processing circuit.

* * * * *